(12) United States Patent
Kishida et al.

(10) Patent No.: US 11,251,020 B2
(45) Date of Patent: *Feb. 15, 2022

(54) SPUTTERING APPARATUS

(71) Applicant: NISSIN ELECTRIC CO., LTD., Kyoto (JP)

(72) Inventors: Shigeaki Kishida, Kyoto (JP); Daisuke Matsuo, Kyoto (JP); Yoshitaka Setoguchi, Kyoto (JP); Yasunori Ando, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 113 days.

This patent is subject to a terminal disclaimer.

(21) Appl. No.: 16/619,942

(22) PCT Filed: Mar. 14, 2018

(86) PCT No.: PCT/JP2018/010005
§ 371 (c)(1),
(2) Date: Dec. 6, 2019

(87) PCT Pub. No.: WO2018/225324
PCT Pub. Date: Dec. 13, 2018

(65) Prior Publication Data
US 2021/0151292 A1 May 20, 2021

(30) Foreign Application Priority Data
Jun. 7, 2017 (JP) .............. JP2017-112591

(51) Int. Cl.
*H01J 37/34* (2006.01)
*H01J 37/32* (2006.01)

(52) U.S. Cl.
CPC ....... *H01J 37/3211* (2013.01); *H01J 37/3417* (2013.01); *H01J 37/3408* (2013.01)

(58) Field of Classification Search
CPC ..... C23C 14/08; C23C 14/34; C23C 14/3407; C23C 14/3464; C23C 14/228;
(Continued)

(56) References Cited

U.S. PATENT DOCUMENTS 6,679,977 B2 * 1/2004 Haag ............... C23C 14/35
  204/192.12
8,052,850 B2 * 11/2011 Lim ............... H01J 37/3423
  204/192.12

(Continued)

FOREIGN PATENT DOCUMENTS

CN   1572900    2/2005
CN   105491780  4/2016
(Continued)

OTHER PUBLICATIONS

"Office Action of China Counterpart Application", dated Mar. 17, 2021, with English translation thereof, pp. 1-14.

(Continued)

*Primary Examiner* — Rodney G Mcdonald
(74) *Attorney, Agent, or Firm* — JCIPRNET

(57) ABSTRACT

The apparatus includes: a vacuum container; a substrate-holding part inside the vacuum container; a target-holding part inside the vacuum container; and a plurality of antennas having a flow channel through which a cooling liquid flows. The antennas include: at least two tubular conductor elements; a tubular insulating element that is arranged between mutually adjacent conductor elements and insulates the conductor elements; and a capacitive element that is connected electrically in series to the mutually adjacent conductor elements. The capacitive element includes: a first electrode which is connected electrically to one of the mutually adjacent conductor elements; a second electrode which is connected electrically to the other of the mutually adjacent conductor elements and is disposed facing the first electrode; and a dielectric substance that fills the space between the first electrode and the second electrode. The dielectric substance is a cooling liquid.

8 Claims, 12 Drawing Sheets

(58) Field of Classification Search
CPC ............... H01J 37/3211; H01J 37/3222; H01J 37/32532; H01J 37/3417; H01J 37/3408; H05H 1/46
USPC .................................................... 204/298.06
See application file for complete search history.

(56) References Cited

U.S. PATENT DOCUMENTS

| | | | | |
|---|---|---|---|---|
| 10,932,353 B2* | 2/2021 | Ando | ............... | H01J 37/32091 |
| 2004/0231973 A1* | 11/2004 | Sato | ............. | C23C 14/086 |
| | | | | 204/192.12 |
| 2005/0103620 A1* | 5/2005 | Chistyakov | ......... | H01J 37/3405 |
| | | | | 204/192.12 |
| 2019/0373710 A1* | 12/2019 | Ando | ............... | H01J 37/32174 |

FOREIGN PATENT DOCUMENTS

| | | | |
|---|---|---|---|
| CN | 110291847 | | 9/2019 |
| JP | H0596062 | | 12/1993 |
| JP | 2002069629 | | 3/2002 |
| JP | 2004346388 | | 12/2004 |
| JP | 2005149887 | | 6/2005 |
| JP | 2014037555 | | 2/2014 |
| JP | 2016065299 | | 4/2016 |
| JP | 2016072168 | | 5/2016 |
| JP | 2017004602 | | 1/2017 |
| WO | WO2018/151114 | * | 8/2018 |

OTHER PUBLICATIONS

"Office Action of Korea Counterpart Application", dated Feb. 8, 2021, with English translation thereof, pp. 1-13.
"International Search Report (Form PCT/ISA/210) of PCT/JP2018/010005," dated Jun. 5, 2018, with English translation thereof, pp. 1-4.

* cited by examiner

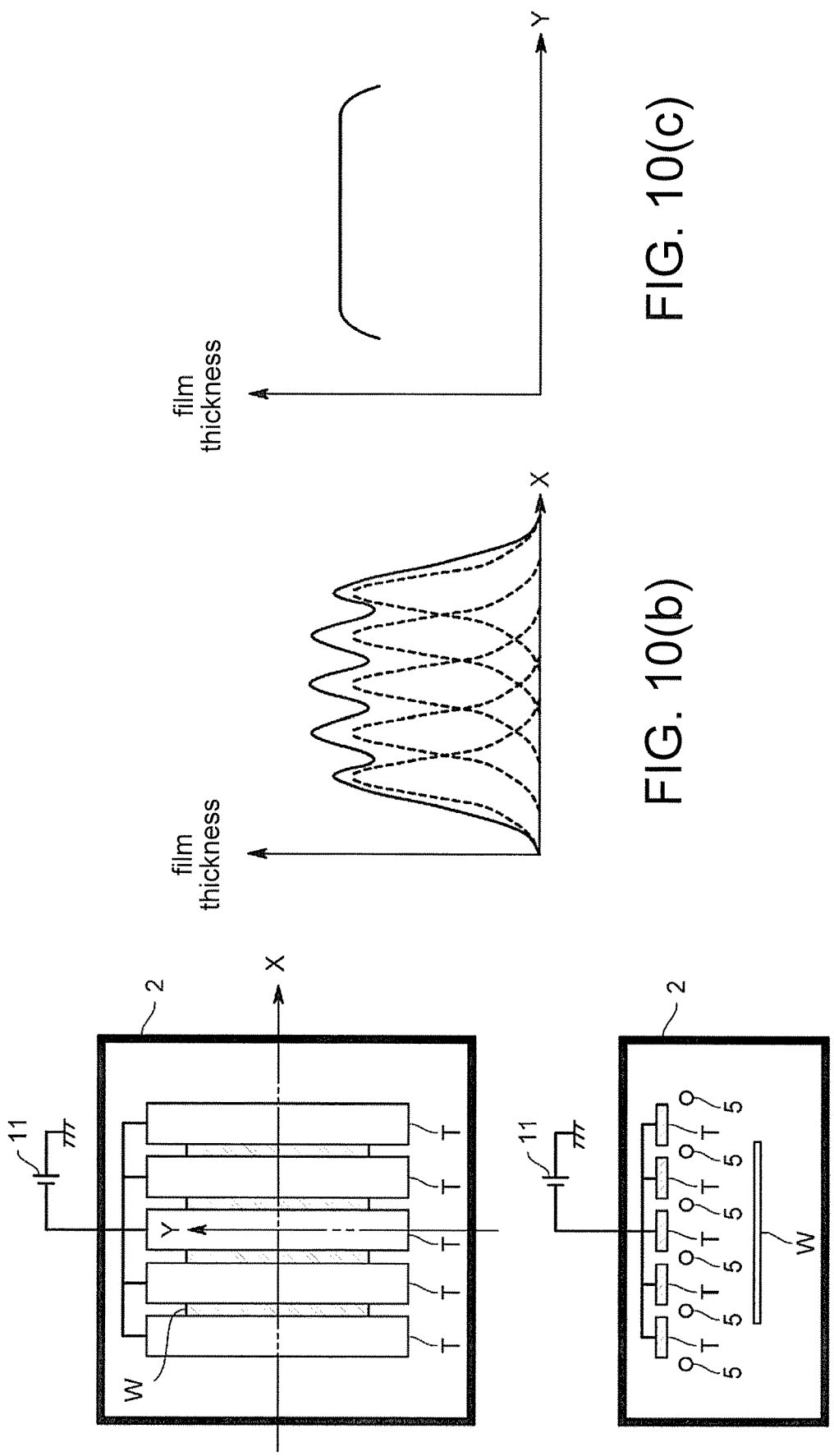

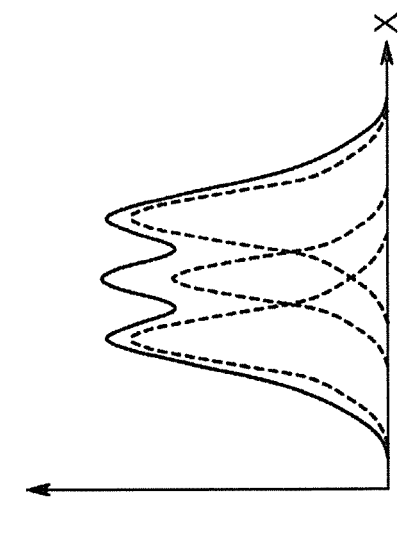
FIG. 11(b)
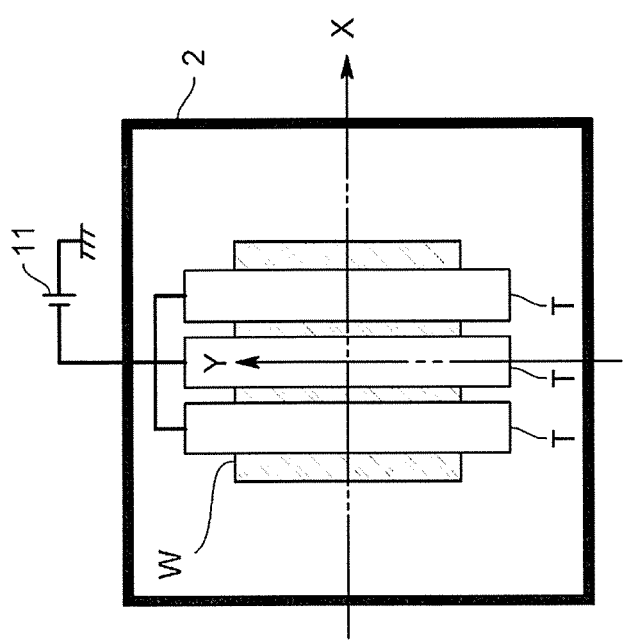
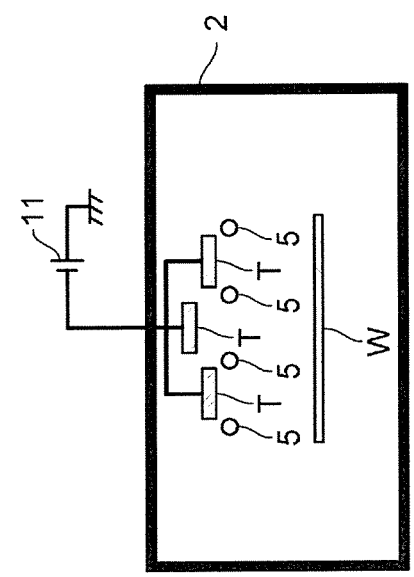
FIG. 11(a)

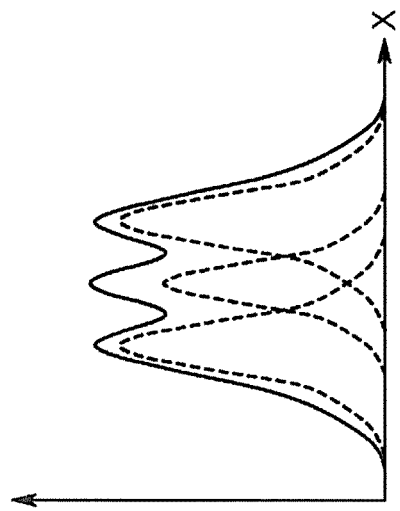
FIG. 12(b)
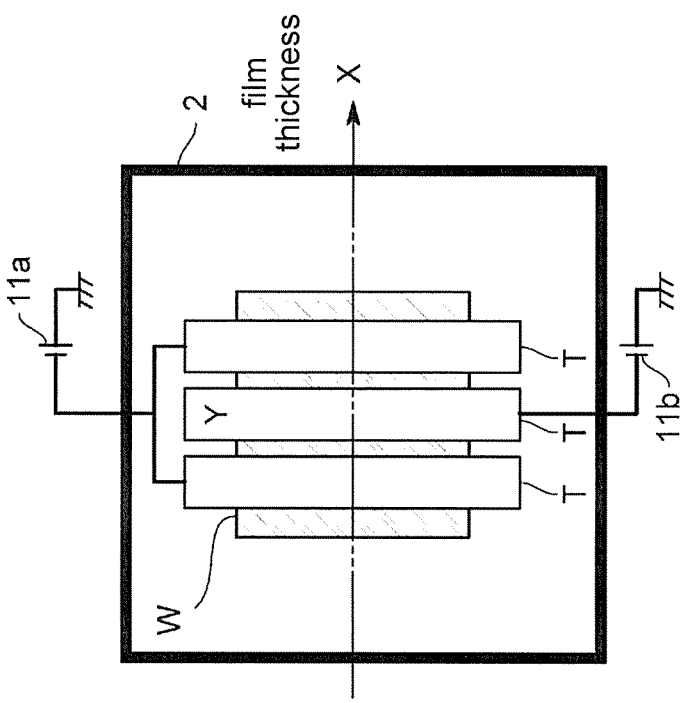
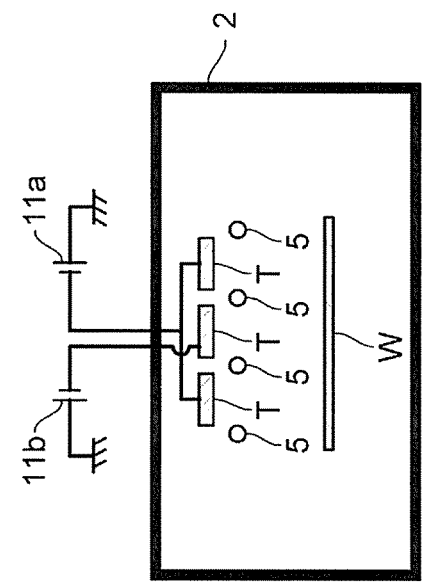
FIG. 12(a)

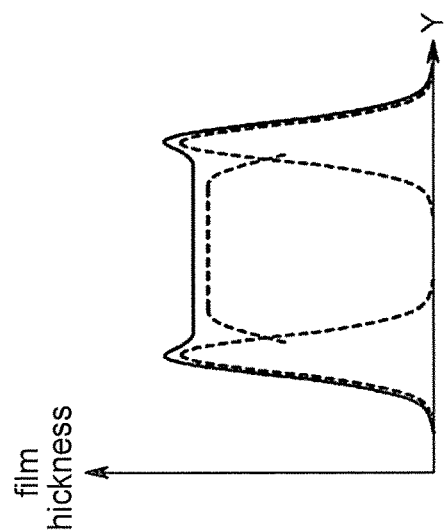
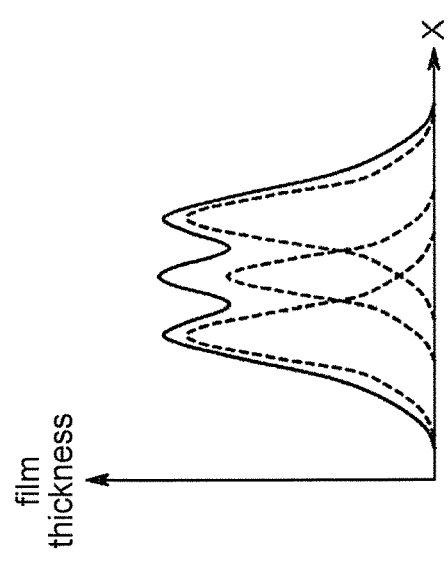
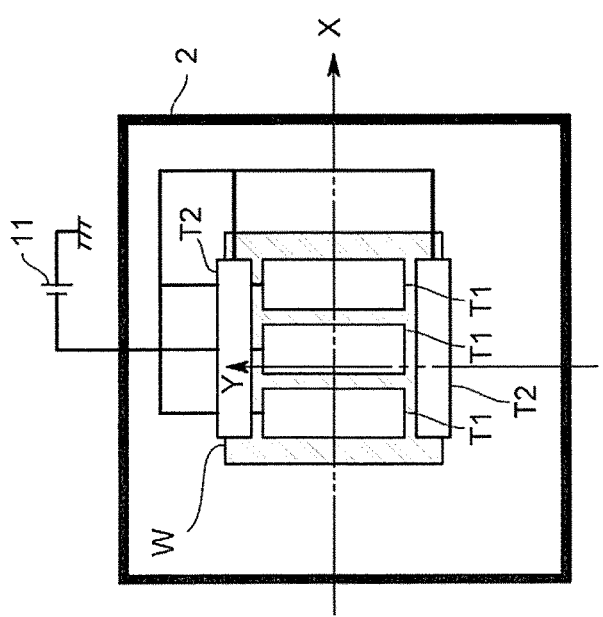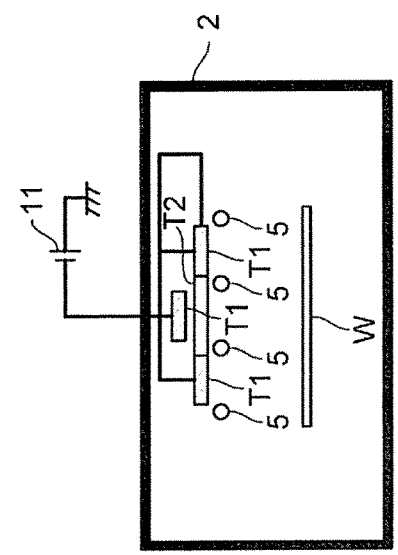
FIG. 13(a)　　FIG. 13(b)　　FIG. 13(c)

SPUTTERING APPARATUS

CROSS-REFERENCE TO RELATED APPLICATION

This application is a 371 application of an international PCT application serial no. PCT/JP2018/010005, filed on Mar. 14, 2018, which claims the priority benefits of Japan Patent application No. 2017-112591, filed on Jun. 7, 2017. The entirety of the above-mentioned patent application is hereby incorporated by reference herein and made a part of this specification.

BACKGROUND OF THE INVENTION

Technical Field

The present invention relates to a sputtering apparatus that performs sputtering on a target with plasma to form a film on a substrate.

Related Art

As this type of sputtering apparatus, a magnetron sputtering apparatus is known. The magnetron sputtering apparatus is configured to form a magnetic field at a front surface of a target by a magnet arranged at a back surface of the target so as to generate plasma and to cause ions in the plasma to collide with the target, and thereby cause sputtered particles to fly out from the target.

In the conventional magnetron sputtering apparatus, sparseness and density plasma is generated in the vicinity of the front surface of the target. Accordingly, the target is not uniformly consumed, and a utilization rate of the target is lowered. In addition, since the target is not uniformly consumed, a film that is generated also has an uneven thickness.

On the other hand, as disclosed in patent literature 1, a sputtering apparatus in which an antenna is disposed in the vicinity of a target and which generates plasma for sputtering by causing a high-frequency current to flow to the antenna is considered. When the plasma is generated using the antenna, sparseness and density of the plasma is lowered, compared to the sparseness and density in a configuration in which plasma is generated using a magnet. By lowering the density of the plasma, it is expected that use efficiency of a target increases and uniformity of film formation also improves.

However, when an antenna is elongated to cope with an increase in size of a substrate in recent years, impedance of the antenna increases, and thereby a large potential difference occurs between two ends of the antenna. As a result, with an influence of the large potential difference, plasma uniformity, such as a plasma density distribution, a potential distribution, or an electron temperature distribution deteriorates. Therefore, density contrast in distribution of sputtered particles coming out from the target occurs, and the film that is generated has an uneven thickness.

In order to solve such a problem, as disclosed in patent literature 2, an apparatus is considered in which a plurality of metal pipes are connected to each other with a hollow insulator interposed between the adjacent metal pipes and a capacitor serving as a capacitive element is disposed at an outer circumferential portion of the hollow insulator. The capacitor is connected electrically in series to the metal pipes at both sides of the hollow insulator and includes a first electrode that is connected electrically to the metal pipe at one side of the hollow insulator, a second electrode that is connected electrically to the metal pipe at the other side of the hollow insulator and overlaps the first electrode, and a dielectric sheet disposed between the first electrode and the second electrode.

LITERATURE OF RELATED ART

Patent Literature

Patent Literature 1: Japanese Paten Laid-Open No. 2016-65299

Patent Literature 2: Japanese Paten Laid-Open No. 2016-72168

SUMMARY

Problems to be Solved

However, because the capacitor has a stacking structure of the first electrode, the dielectric sheet, and the second electrode, a gap may be formed between the electrodes and the dielectric sheet. In this case, the gap causes plasma uniformity to deteriorate. Therefore, there is a concern that density contrast in distribution of sputtered particles coming out from the target occurs and the film that is generated has an uneven thickness.

Therefore, the present invention is made to solve the problem described above, and a main object thereof is to efficiently generate plasma for sputtering using an antenna and to improve plasma uniformity so as to improve the uniformity of film formation.

Means to Solve Problems

That is, a sputtering apparatus according to the present invention performs sputtering on a target with plasma to form a film on a substrate, the sputtering apparatus including: a vacuum container, which is evacuated and into which a gas is introduced; a substrate-holding part for holding a substrate inside the vacuum container; a target-holding part for holding the target so as to face the substrate inside the vacuum container; and a plurality of antennas which generates the plasma and have a flow channel in which a cooling liquid flows. The antenna includes at least two tubular conductor elements, a tubular insulating element that is arranged between mutually adjacent conductor elements and insulates the conductor elements, and a capacitive element that is arranged in the flow channel and is connected electrically in series to the mutually adjacent conductor elements. The capacitive element includes a first electrode that is connected electrically to one of the mutually adjacent conductor elements, a second electrode that is connected electrically to the other of the mutually adjacent conductor elements and is disposed facing the first electrode, and a dielectric substance that fills a space between the first electrode and the second electrode, and the dielectric substance is the cooling liquid.

According to the above sputtering apparatus, since the capacitive element is connected electrically in series to the mutually adjacent conductor elements via the insulating element, to be simply put, synthetic reactance of the antenna is obtained by subtracting capacitive reactance from inductive reactance, and the impedance of the antenna can be reduced. As a result, even in a case of an elongated antenna, an increase in the impedance of the antenna can be inhibited, a high-frequency current easily flows to the antenna, and thus the plasma can be efficiently generated. Consequently, the density of the plasma can be increased, and a film forming speed can be increased.

In particular, according to the present invention, since the space between the first electrode and the second electrode is filled with the cooling liquid and used as dielectric substance, it is possible to eliminate a gap formed between the electrodes and the dielectric substance which configure the capacitive element. As a result, uniformity of the plasma can be improved, and uniformity of film formation can be improved. In addition, by using the cooling liquid as the dielectric substance, there is no need to prepare a dielectric substance of a liquid different from the cooling liquid, and the first electrode and the second electrode can be cooled. In general, the cooling liquid is adjusted to a constant temperature by a temperature adjusting mechanism, and the cooling liquid is used as the dielectric substance, and thereby it is possible to inhibit a change in relative dielectric constant caused by a change in temperature so as to inhibit a change in capacitance value. Consequently, it is also possible to improve the uniformity of the plasma. Further, when water is used as the cooling liquid, the relative dielectric constant of water is about 80 (20° C.) and is higher than that of a dielectric sheet made of resin, and thus it is possible to configure a capacitive element that resists a high voltage.

Moreover, according to the present invention, since the setting of a high-frequency voltage supplied to the antenna and a bias voltage to the target can be performed independently, it is possible to set the bias voltage to a low voltage independently from generation of the plasma to the extent that ions in the plasma are attracted to the target such that sputtering is performed. As a result, since it is possible to perform the sputtering on the target with a low voltage, it is possible to reduce a change between material composition of the target and a composition of a film formed on the substrate. In addition, since the plasma for sputtering is generated using the antenna, it is possible to more uniformly consume the target and to improve use efficiency of the target, compared to the case of a magnetron sputtering apparatus. Furthermore, the present invention employs a configuration in which a direct current magnetic field is not formed in the vicinity of a front surface of the target, and the present invention is easily applied to a magnetic material.

Besides, arc discharge that may occur in the gap between the electrodes and the dielectric substance can be eliminated, and the capacitive element can be prevented from being damaged due to the arc discharge. In addition, it is possible to set the capacitance value with high precision based on a distance between the first electrode and the second electrode, a facing surface area, and the relative dielectric constant of the cooling liquid, without consideration of the gap. Further, a structure for pressing the electrodes and the dielectric substance to fill the gap is not required, and it is possible to prevent complexity of a structure around the antenna caused by the pressing structure and prevent deterioration of the uniformity of the plasma due to the complexity.

For example, when the target is an oxide semiconductor material such as InGaZnO, the configuration of the present invention has a remarkable effect. When the oxide semiconductor material is used as the target, it is easy to generate sputtered particles from which oxygen has escaped when the bias voltage increases. As a result, the material composition of the target is different from the composition of the film formed on the substrate, and film quality deteriorates. On the other hand, in the sputtering apparatus of the present invention, it is possible to cause the bias voltage which is applied to the target to be lower than that (for example, −1 to −2 kV) in the related art, and it is possible to limit generation of the sputtered particles from which oxygen has escaped. As a result, it is possible to form a film, in which the same oxide state as the target material is maintained, on the substrate, and it is possible to form a film having a high quality.

The sputtering apparatus includes a sputtering gas supply mechanism that supplies, to the vacuum container, a sputtering gas for sputtering the target. In the present invention, the bias voltage which is applied to the target can be lowered, and thus the sputtered particles, from which oxygen has not escaped, reach the substrate. As a result, the sputtering gas supply mechanism may supply only an argon gas to the vacuum container. In this manner, since only the argon gas may be supplied, it is possible to increase the film forming speed, compared to a case that an oxygen gas is supplied as well as the argon gas.

As a specific embodiment of the electrodes, desirably, each of the electrodes has a flange portion which comes into electrical contact with an end portion of the conductor elements at a side of the insulating element and an extension portion extended from the flange portion toward the side of the insulating element.

In this configuration, a contact area of the electrode with the conductor element is increased by the flange portion, and facing surface area between the electrodes can be set by the extension portion.

Desirably, the extension portions of the respective electrodes have a tubular shape and are disposed coaxially with each other.

In this configuration, the facing surface area between the electrodes is increased, and a distribution of the high-frequency current flowing to the conductor element is made uniform in a circumferential direction such that it is possible to generate the plasma having excellent uniformity.

However, when a plurality of elongated targets arranged to be substantially parallel to each other are disposed substantially at the same height from the front surface of the substrate, a film-thickness distribution of a film formed on the front surface of the substrate (film-thickness distribution obtained by overlapping film thicknesses due to the targets) is thin at respective outer sides of the targets in an arrangement direction.

In order to inhibit variations in film thickness in the arrangement direction of the targets, for example, there is a method of arranging sub-targets for compensating the film thicknesses at both sides in the arrangement direction at the respective outer sides of the targets in the arrangement direction, the targets being mainly used in forming a film on the substrate; however, in this method, a problem arises in that the necessary number of targets T increases.

Therefore, in order to inhibit variations in film thickness along the arrangement direction without an unnecessary increase of the targets, it is preferable that the target-holding part holds the plurality of elongated targets along the front surface of the substrate in a state that the targets are substantially parallel to each other, and of the plurality of targets, the targets respectively positioned at outer sides in the arrangement direction are closer to the front surface of the substrate than the target positioned at an inner side in the arrangement direction.

In this configuration, since the targets respectively positioned at the outer sides in the arrangement direction are closer to the front surface of the substrate than the target positioned at the inner side in the arrangement direction, it is possible to increase film thicknesses at the outer sides in the arrangement direction, respectively.

Consequently, variations in film thickness along the arrangement direction can be inhibited without arranging more targets at both sides of the targets mainly used in film formation.

As another embodiment arranged to inhibit variations in film thickness along the arrangement direction without arranging more targets at both sides of the targets mainly used in film formation, there is provided a configuration in which the target-holding part holds the plurality of elongated targets along the front surface of the substrate in a state that the targets are substantially parallel to each other, and of the plurality of targets, an applied voltage to the targets respectively positioned at the outer sides in the arrangement direction is higher than an applied voltage to the target positioned at the inner side in the arrangement direction.

In this configuration, since the applied voltage to the targets respectively positioned at the outer sides in the arrangement direction is higher than the applied voltage to the target positioned at the inner side in the arrangement direction, the film thicknesses at the outer sides in the arrangement direction can be increased, respectively.

When the target has a thin film thickness at both sides in a longitudinal direction as well as in the arrangement direction of the target, in order to inhibit the film thickness at both sides in the longitudinal direction from being thin, preferably, the target-holding part holds the plurality of elongated targets along the front surface of the substrate in a state that the targets are substantially parallel to each other, and the target holding part is arranged at both sides of the targets in the longitudinal direction to hold a pair of second targets extended along the arrangement direction of the targets.

In this configuration, since a pair of second targets is arranged at both sides in the longitudinal direction of the targets, it is possible to form films at both sides in the longitudinal direction by performing sputtering on the second targets, and it is possible to inhibit the films at both sides in the longitudinal direction from being thin.

Effect

According to the present invention configured as described above, plasma for sputtering is efficiently generated using an antenna and plasma uniformity can be improved so as to improve the uniformity of film formation.

BRIEF DESCRIPTION OF THE DRAWINGS

FIG. 10(a) to FIG. 10(c) are views for describing a film-thickness distribution in an arrangement direction and a longitudinal direction of targets.

FIG. 11(a) to FIG. 11(b) are schematic diagrams of a sputtering apparatus for describing arrangement of targets of a modification embodiment.

FIG. 12(a) to FIG. 12(b) are schematic diagrams of a sputtering apparatus for describing arrangement of targets of a modification embodiment.

FIG. 13(a) to FIG. 13(c) are schematic diagrams of a sputtering apparatus for describing arrangement of targets of a modification embodiment.

DESCRIPTION OF THE EMBODIMENTS

Hereinafter, an embodiment of a sputtering apparatus according to the present invention will be described with reference to the drawings.

<Configuration of Apparatus>

A sputtering apparatus 100 of the embodiment performs sputtering on a target T with inductively coupled plasma P to form a film on a substrate W. Here, the substrate W is a substrate for a flat panel display (FPD) such as a liquid crystal display or an organic EL display, a flexible substrate for a flexible display, or the like.

Figure 1:
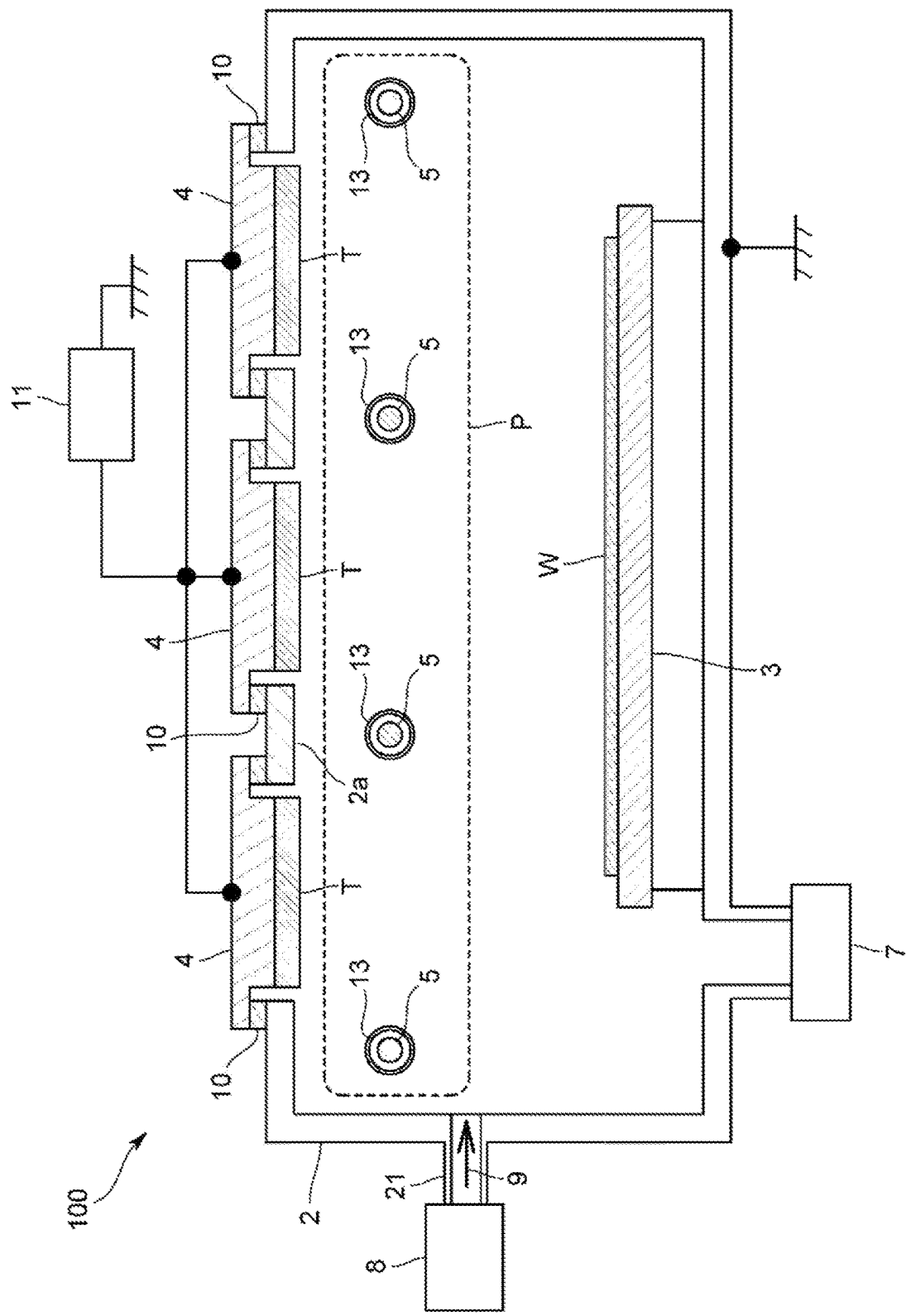
FIG. 1 is a longitudinal sectional view orthogonal to a longitudinal direction of an antenna and schematically showing a configuration of a sputtering apparatus of an embodiment.
Figure 2:
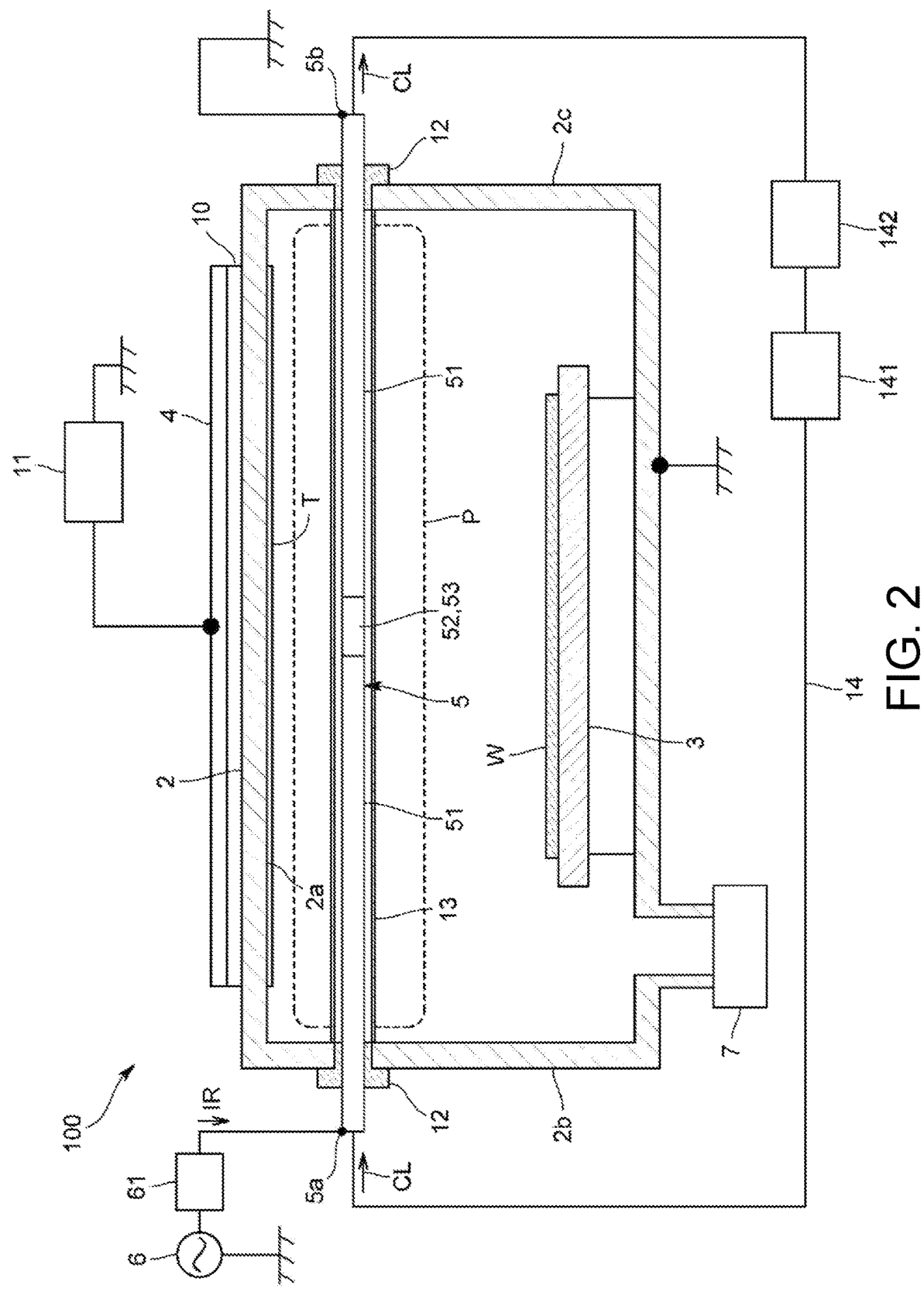
FIG. 2 is a longitudinal sectional view along a longitudinal direction of the antenna and schematically showing the configuration of the sputtering apparatus of the embodiment.

Specifically, as illustrated in FIGS. 1 and 2, the sputtering apparatus 100 includes a vacuum container 2 which is evacuated and into which a gas is introduced, a substrate-holding part 3 for holding the substrate W inside the vacuum container 2, a target-holding part 4 for holding the target T inside the vacuum container 2, a plurality of antennas 5 being straight and disposed inside the vacuum container 2, and a high-frequency power supply 6 that applies high-frequency waves to the plurality of antennas 5, the high-frequency wave being applied to generate the inductively coupled plasma P inside the vacuum container 2. Moreover, by applying the high-frequency waves from the high-frequency power supply 6 to the plurality of antennas 5, a high-frequency current IR flows in the plurality of antennas 5, and an induced electrical field is generated inside the vacuum container 2 to generate the inductively coupled plasma P.

The vacuum container 2 is a container made of metal for example, and an inside thereof is evacuated by an evacuation device 7. In this example, the vacuum container 2 is electrically grounded.

A sputtering gas 9 is introduced into the vacuum container 2 through a gas introduction inlet 21 and a sputtering gas supply mechanism 8 having, for example, a flow rate adjustor (not shown) or the like. The sputtering gas 9 is an inert gas such as argon (Ar), for example. The sputtering gas supply mechanism 8 of the embodiment supplies only an argon gas into the vacuum container 2.

The substrate-holding part 3 is a holder that holds the substrate W having a flat plate shape in the vacuum container 2 such that the substrate comes into a horizontal state for example. In this example, the holder is electrically grounded.

The target-holding part 4 holds the target T to face the substrate W held by the substrate-holding part 3. The target T of the embodiment has a flat plate shape with a rectangular shape in a plan view and is an oxide semiconductor material such as InGaZnO, for example. The target-holding part 4 is arranged at a side wall 2a (for example, upper wall) that forms the vacuum container 2. In addition, an insulating part 10 having a vacuum-sealing function is arranged between the target-holding part 4 and the upper wall 2a of the vacuum container 2. In this example, a target bias power supply 11 that applies a target bias voltage to the target T is connected to the target T via the target-holding part 4. The target bias voltage is a voltage that causes ions ($Ar^+$) in the plasma P to be attracted to the target T so as to perform the sputtering. The target bias voltage of the embodiment is a negative voltage of −1 kV or higher and, preferably, −200 to −600 V.

In the embodiment, a plurality of the target-holding parts 4 is arranged. The plurality of target-holding parts 4 are disposed in parallel on the same plane at a side of a front surface of the substrate W inside the vacuum container 2 so as to be disposed along the front surface of the substrate W (for example, practically parallel to a back surface of the substrate W). The plurality of target-holding parts 4 are disposed at equal intervals so that longitudinal directions of the target-holding parts 4 are parallel to each other. Consequently, as illustrated in FIG. 1, the plurality of targets T disposed inside the vacuum container 2 is practically parallel to the front surface of the substrate W and is disposed at equal intervals so that longitudinal directions of the targets T are parallel to each other. Moreover, the target-holding parts 4 have the same configuration.

The plurality of antennas 5 is disposed in parallel on the same plane at the side of the front surface of the substrate W inside the vacuum container 2 so as to be disposed along the front surface of the substrate W (for example, practically parallel to the front surface of the substrate W). The plurality of antennas 5 is disposed at equal intervals so that longitudinal directions of the antennas 5 are parallel to each other. Moreover, the antennas 5 have a straight line shape in a plan view and have the same configuration, and a length of the antenna is several tens of centimeters or more.

As illustrated in FIG. 1, the antennas 5 of the embodiment are respectively disposed at both sides of the targets T held by the target-holding parts 4. In other words, the antennas 5 and the targets T are alternately disposed, and one target T is configured to be sandwiched between two antennas 5. Here, the longitudinal direction of the antennas 5 is the same direction as the longitudinal direction of the targets T held by the target-holding parts 4.

In addition, a material of the antennas 5 includes copper, aluminum, alloys thereof, stainless steel, and the like; however, the material is not limited thereto. Moreover, the antenna 5 may be hollow to allow a refrigerant such as cooling water flow therein so as to cool the antenna 5.

Moreover, as illustrated in FIG. 2, both end portions of the antenna 5 penetrate side walls 2b and 2c of the vacuum container 2, respectively, the side walls 2b and 2c facing each other. Insulating members 12 are respectively arranged at portions penetrated by both end portions of the antenna 5 toward the outside of the vacuum container 2. Both end portions of the antenna 5 penetrate the insulating members 12, and penetrating portions thereof are vacuum-sealed by packings, for example. Spaces between the insulating members 12 and the vacuum container 2 are also vacuum-sealed by packings, for example. Moreover, a material of the insulating member 12 includes ceramics such as alumina, quartz, engineering plastics such as polyphenylene sulfide (PPS) or polyether ether ketone (PEEK), and the like.

Further, portions of the antennas 5 which are positioned inside the vacuum container 2 are covered by an insulating cover 13 which is made of an insulating substance and has a shape of straight tube. Spaces between both end portions of the insulating cover 13 and the vacuum container 2 may not be sealed. The reason is that, even when the gas 9 enters the space in the insulating cover 13, the space is small and a movement distance of electrons is short, and thus the plasma P is not generated in the space, in general. Moreover, a material of the insulating cover 13 includes quartz, alumina, fluororesin, silicon nitride, silicon carbide, silicon, and the like; however, the material is not limited thereto.

The high-frequency power supply 6 is connected to a power-feed end portion 5a which is one end portion of the antenna 5 via a matching circuit 61, and a terminal portion 5b which is the other end portion of the antenna 5 is directly grounded. Moreover, an impedance adjusting circuit of a variable capacitor, a variable reactor, or the like may be arranged at the power-feed end portion 5a or the terminal portion 5b to adjust impedance of the antennas 5. Adjustment of the impedance of the antennas 5 in this manner enables a density distribution of the plasma P to be uniform in the longitudinal direction of the antenna 5 and enables a film thickness to be uniform in the longitudinal direction of the antenna 5.

According to the configuration described above, it is possible to cause the high-frequency current IR to flow from the high-frequency power supply 6 via the matching circuit 61 to the antenna 5. For example, a high frequency is generally 13.56 MHz; however, the high frequency is not limited thereto.

Figure 3:
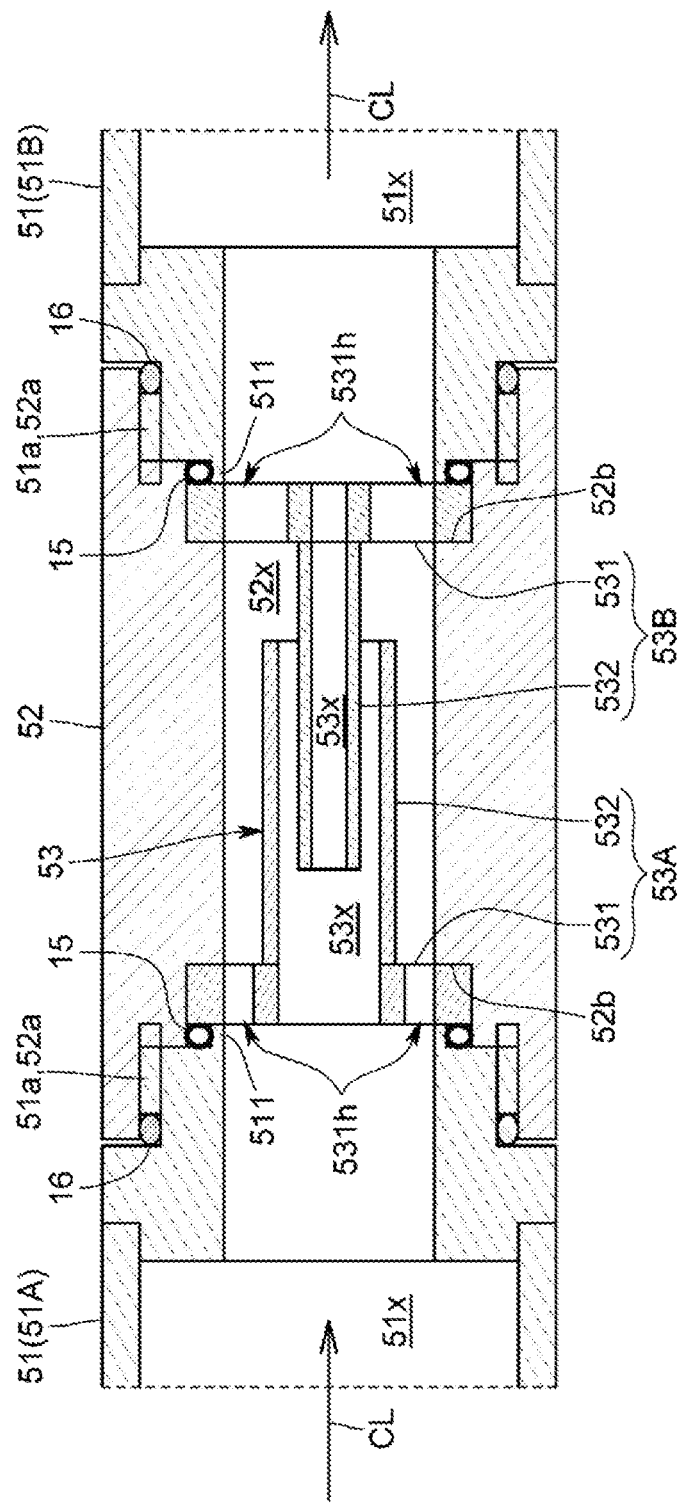
FIG. 3 is a partially enlarged sectional view showing a capacitor portion in the antenna of the embodiment.

Besides, the antenna 5 of the embodiment has a hollow structure in which a flow channel is formed inside, a cooling liquid CL flowing through the flow channel. Specifically, as illustrated in FIG. 3, the antenna 5 has at least two tubular conductor elements 51 (hereinafter, referred to as "metal pipes 51") made of metal, a tubular insulating element 52 (hereinafter, referred to as an "insulating pipe 52") that is arranged between the mutually adjacent metal pipes 51 and insulates the metal pipes 51, and a capacitor 53 which is a capacitive element connected electrically in series to the mutually adjacent metal pipes 51.

In the embodiment, there are two metal pipes 51, one insulating pipe 52 and one capacitor 53. In the following description, one of the metal pipes 51 is referred to as a "first metal pipe 51A", and the other of the metal pipes is referred to as a "second metal pipe 51B". Moreover, the antenna 5 may be configured to have three metal pipes 51 or more. In this case, the numbers of the insulating pipes 52 and the capacitors 53 are both smaller by 1 than the number of metal pipes 51.

Moreover, the cooling liquid CL flows in the antenna 5 through a circulation channel 14 arranged outside the vacuum container 2, and the circulation channel 14 has a temperature adjusting mechanism 141 such as a heat exchanger that adjusts a temperature of the cooling liquid CL to a constant temperature and a circulating mechanism 142 such as a pump that circulates the cooling liquid CL in the circulation channel 14. From the viewpoint of electrical insulation, as the cooling liquid CL, water having high resistance is preferably used, for example, pure water or water similar to pure water is preferably used. Besides, a liquid refrigerant other than water, such as a fluorine-based inert liquid, may be used.

The metal pipe 51 has a straight pipe shape having a straight flow channel 51x in which the cooling liquid CL flows. Besides, a male screw portion 51a is formed at an outer circumferential portion of at least on end portion of the metal pipe 51 in the longitudinal direction. In the metal pipe 51 of the embodiment, the end portion having the male screw portion 51a and members other than the end portion are formed by separate components and are joined to each other; however, the metal pipe 51 may also be formed by one single member. Moreover, in order to achieve the universality with a configuration configured to connect a plurality of metal pipes 51, it is desirable that the metal pipe 51 have the male screw portions 51a at both end portions in the longitudinal direction to have interchangeability. A material of the metal pipe 51 includes copper, aluminum, alloys thereof, stainless steel, and the like.

The insulating pipe 52 has a straight pipe shape having a straight flow channel 52x in which the cooling liquid CL flows. Besides, side circumferential walls of both end portions of the insulating pipe 52 in an axial direction thereof have female screw portions 52a which are screwed and connected to the male screw portions 51a of the metal pipe 51. In addition, in the side circumferential walls of both end portions of the insulating pipe 52 in the axial direction thereof, recessed portions 52b, into which the electrodes 53A and 53B of the capacitor 53 are fitted, are formed across the entire circumferential direction at a side closer to the center in the axial direction than the female screw 52a. The insulating pipe 52 of the embodiment is formed by one single member; however, the insulating pipe is not limited thereto. Moreover, a material of the insulating pipe 52 includes alumina, fluororesin, polyethylene (PE), engineering plastics (for example, polyphenylene sulfide (PPS) or polyether ether ketone (PEEK)), and the like.

The capacitor 53 is arranged inside the insulating pipe 52, specifically, in the flow channel 52x of the insulating pipe 52 in which the cooling liquid CL flows.

Specifically, the capacitor 53 includes a first electrode 53A, which is connected electrically to one (first metal pipe 51A) of the mutually adjacent metal pipes 51, and a second electrode 53B which is connected electrically to the other (second metal pipe 51B) of the mutually adjacent metal pipes 51 and is disposed facing the first electrode 53A, and the capacitor 53 is configured in a manner that a space between the first electrode 53A and the second electrode 53B is filled with the cooling liquid CL. In other words, the cooling liquid CL flowing in the space between the first electrode 53A and the second electrode 53B is a dielectric substance that configures the capacitor 53.

The electrodes 53A and 53B substantially have a shape of a rotating body and has a main flow channel 53x at a central portion along a central axis of the electrodes. Specifically, each of the electrodes 53A and 53B has a flange portion 531 which comes into electrical contact with an end portion of the metal pipe 51 at a side of the insulating pipe 52 and an extension portion 532 extended from the flange portion 531 toward the side of the insulating pipe 52. In the electrodes 53A and 53B of the embodiment, the flange portion 531 and the extension portion 532 may be formed by one single member or may be formed by separate components and be joined to each other. A material of the electrodes 53A and 53B includes aluminum, copper, alloys thereof, and the like.

The flange portion 531 comes into contact with the end portion of the metal pipe 51 at the side of the insulating pipe 52 across the entire circumferential direction. Specifically, an end surface of the flange portion 531 in the axial direction comes into contact with a front end surface of a cylindrical contact portion 511 formed at the end portion of the metal pipe 51 across the entire circumferential direction, and comes into electrical contact with the end portion of the metal pipe 51 via a ring-shaped multi-surface contactor 15 arranged at an outer circumference of the contact portion 511 of the metal pipe 51. Moreover, the flange portion 531 may come into electrical contact with the metal pipe 51 through any one of the connections described above.

In addition, in the flange portion 531, a plurality of through-holes 531h is formed in a thickness direction. By arranging the through-holes 531h in the flange portion 531, flow-channel resistance of the cooling liquid CL caused by the flange portion 531 is decreased, and it is possible to prevent the cooling liquid CL from remaining in the insulating pipe 52 and to prevent bubbles from accumulating in the insulating pipe 52.

The extension portion 532 has a cylindrical shape and has the main flow channel 53x formed inside. The extension portion 532 of the first electrode 53A and the extension portion 532 of the second electrode 53B are coaxially disposed. In other words, the extension portion 532 of the second electrode 53B is arranged in a state of being inserted into the extension portion 532 of the first electrode 53A. Consequently, a cylindrical space along a flow channel direction is formed between the extension portion 532 of the first electrode 53A and the extension portion 532 of the second electrode 53B.

The electrodes 53A and 53B configured as described above are fitted into the recessed portions 52b formed in the side circumferential walls of the insulating pipe 52. Specifically, the first electrode 53A is fitted into the recessed portion 52b formed at one end side of the insulating pipe 52 in the axial direction, and the second electrode 53B is fitted into the recessed portion 52b formed at the other end side of the insulating pipe 52 in the axial direction. In this manner, the electrodes 53A and 53B are fitted into the recessed portions 52b, and thereby the extension portion 532 of the first electrode 53A and the extension portion 532 of the second electrode 53B are coaxially disposed. In addition, the end surfaces of the flange portions 531 of the electrodes 53A and 53B come into contact with surfaces of the recessed portion 52b directed outward in the axial direction, and thereby an insertion dimension of the extension portion 532 of the second electrode 53B into the extension portion 532 of the first electrode 53A is defined.

In addition, by fitting the electrodes 53A and 53B into the recessed portions 52b of the insulating pipe 52 and screwing the male screw portions 51a of the metal pipes 51 to the female screw portions 52a of the insulating pipe 52, the front end surfaces of the contact portions 511 of the metal pipes 51 come into contact with the flange portions 531 of the electrodes 53A and 53B and the electrodes 53A and 53B are sandwiched and fixed between the insulating pipe 52 and the metal pipes 51. In this way, the antenna 5 of the embodiment has a configuration in which the metal pipes 51, the insulating pipe 52, the first electrode 53A, and the second electrode 53B are coaxially disposed. Moreover, contact portions between the metal pipes 51 and the insulating pipe 52 have a sealing structure with respect to vacuum and the cooling liquid CL. The sealing structure of the embodiment is realized by a sealing member 16 such as a packing arranged at a proximal end portion of the male screw portion 51a. Moreover, a tapered screw structure for a pipe may be used.

In this manner, the sealing between the metal pipes 51 and the insulating pipe 52 and the electrical contact between the metal pipes 51 and the electrodes 53A and 53B are performed together with the fastening of the male screw portion 51a and the female screw portion 52a, and thus assembly work is very simple.

In this configuration, when the cooling liquid CL flows from the first metal pipe 51A, the cooling liquid CL flows toward a side of the second electrode 53B through the main flow channel 53x and the through-holes 531h of the first electrode 53A. The cooling liquid CL reaching the second electrode 53B flows to the second metal pipe 51B through the main flow channel 53x and the through-holes 531h of the second electrode 53B. In this case, a cylindrical space between the extension portion 532 of the first electrode 53A and the extension portion 532 of the second electrode 53B is filled with the cooling liquid CL, and the cooling liquid CL becomes the dielectric substance and configures the capacitor 53.

<Evaluation of Relationship between Target Bias Voltage and Film Forming Speed>

In the sputtering apparatus 100 of the embodiment, a relationship between the target bias voltage (V) and the film forming speed (nm/min) was evaluated. Moreover, the target T used is IGZO1114 and has a size of 150×1000 mm. An inter-antenna distance (pitch width) is 200 mm. A distance between the target and the substrate is 125 mm. The substrate W has a size of 320×400 mm.

The vacuum container 2 was evacuated to $3\times10^{-6}$ Torr or lower. Then, while a sputtering gas (Ar gas) of 100 sccm was introduced, a pressure in the vacuum container 2 was adjusted to 1.3 Pa. High-frequency power of 5 kW, 7 kW, or 8 kW was supplied to the plurality of antennas 5, and the inductively coupled plasma P was generated and maintained. A direct current voltage pulse (50 kHz and duty of 97%) was applied to the target T to perform sputtering on the target T and measure the film forming speed.

Figure 4:
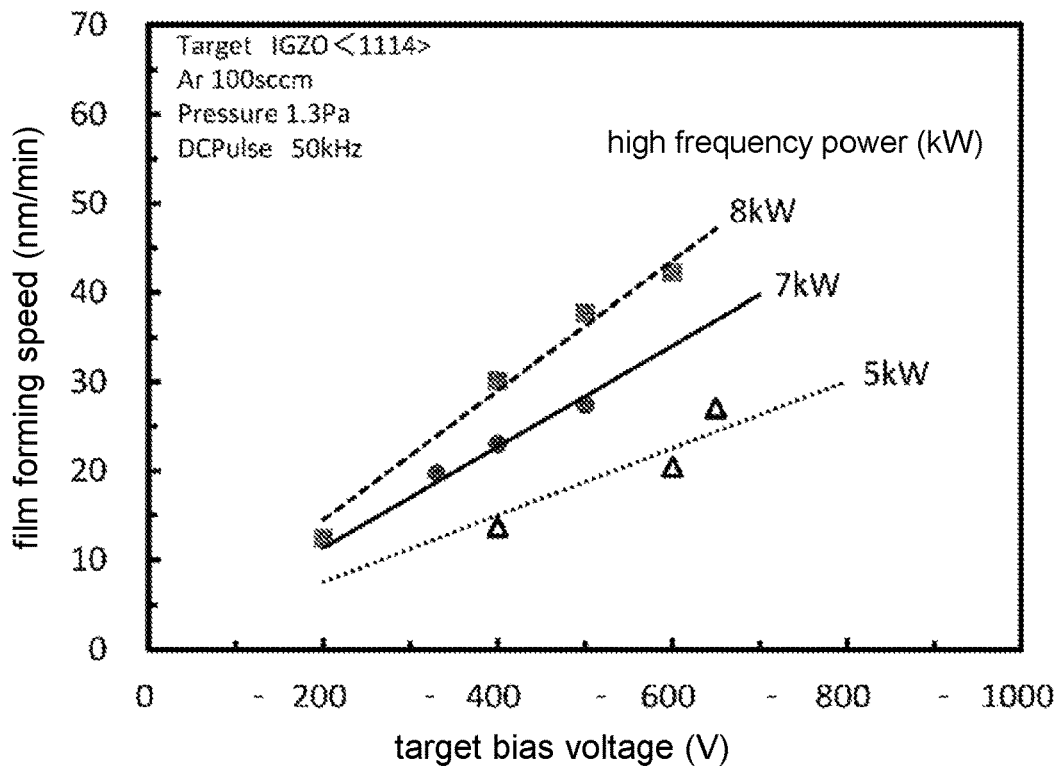
FIG. 4 is a graph showing a relationship between a target bias voltage and a film forming speed.

FIG. 4 shows film forming speeds for each target bias voltage at each high-frequency power. For example, in a case that the sputtering is required to be performed at a film forming speed of 25 nm/min, the target bias voltage may be set to −665 V when the high-frequency power is 5 kW, to −440 V when the high-frequency power is 7 kW, and to −344 V when the high-frequency power is 8 kW.

<Evaluation of Film Forming Speed Based on Concentration of Oxygen Gas>

With the sputtering apparatus 100 of the embodiment, the film forming speed when the argon gas and an oxygen gas were supplied into the vacuum container was evaluated. Moreover, the target T used is IGZO1114 and has a size of 150×1000 mm. The inter-antenna distance (pitch width) is 200 mm. The distance between the target and the substrate is 125 mm. The substrate W has a size of 320×400 mm.

The vacuum container 2 was evacuated to $3\times10^{-6}$ Torr or lower. Then, while a mixed gas (argon gas+oxygen gas) of 100 sccm was introduced, the pressure in the vacuum container 2 was adjusted to 0.9 Pa. High-frequency power of 7 kW or 8 kW was supplied to the plurality of antennas 5, and the inductively coupled plasma P was generated and maintained. A direct current voltage pulse (50 kHz and duty of 97%) of −400 V was applied to the target T to perform sputtering on the target T and measure the film forming speed.

Figure 5:
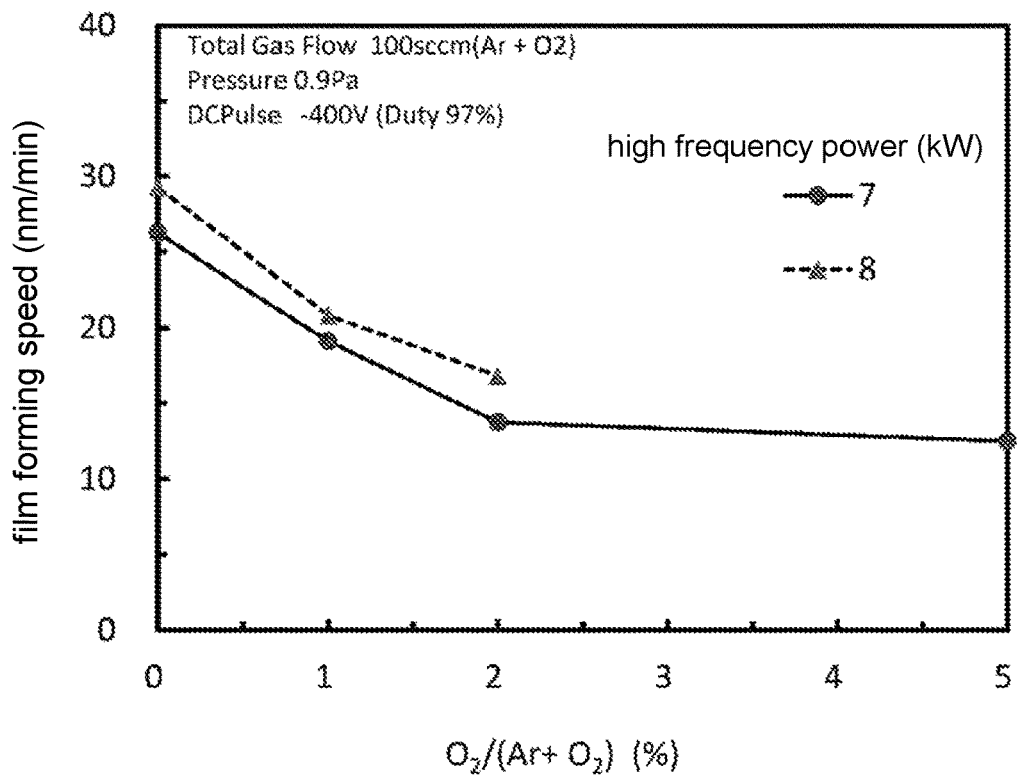
FIG. 5 is a graph showing a relationship between concentration of an oxygen gas and a film forming speed.

FIG. 5 shows a film forming speed when the concentration of oxygen gas is changed with high-frequency power. As seen from FIG. 5, it is evident that the film forming speed slows down as the concentration of oxygen gas increases and the film forming speed is the greatest when only argon gas is supplied for film formation.

<Evaluation of Oxygen Binding State of IGZO Film>

An oxygen binding state of an IGZO film (IGZO film according to the present invention) formed by using the sputtering apparatus 100 of the embodiment was analyzed using an X-ray photoelectron spectrometer (XPS analyzer (AXIS ULTRA manufactured by Shimadzu Corporation). In addition, an oxygen binding state of an IGZO film (IGZO film according to a conventional example) formed by using a conventional type of RF magnetron sputtering apparatus (ESS-300 manufactured by Eiko Co., Ltd.) was analyzed using the XPS analyzer.

IGZO Film According to Present Invention:

The vacuum container 2 was evacuated to $3\times10^{-6}$ Torr or lower. Then, while the sputtering gas (only Ar gas) of 100 sccm was introduced, the pressure in the vacuum container 2 was adjusted to 1.3 Pa. High-frequency power of 7 kW was supplied to the plurality of antennas 5, and the inductively coupled plasma P was generated and maintained. The direct current voltage pulse (50 kHz and duty of 97%) of −400 V was applied to the target T to perform sputtering on the target T (IGZO1114) and form a film.

IGZO Film According to Conventional Example:

The vacuum container was evacuated to $3\times10^{-6}$ Torr or lower. Then, while the sputtering gas (Ar gas) of 19.1 sccm and oxygen gas of 0.9 sccm (mixed gas having oxygen concentration of 4.5%) were introduced, the pressure in the vacuum container was adjusted to 0.6 Pa. The high-frequency power of 100 W was supplied to a cathode to perform sputtering on the target T (IGZO1114) and form a film.

Figure 6:
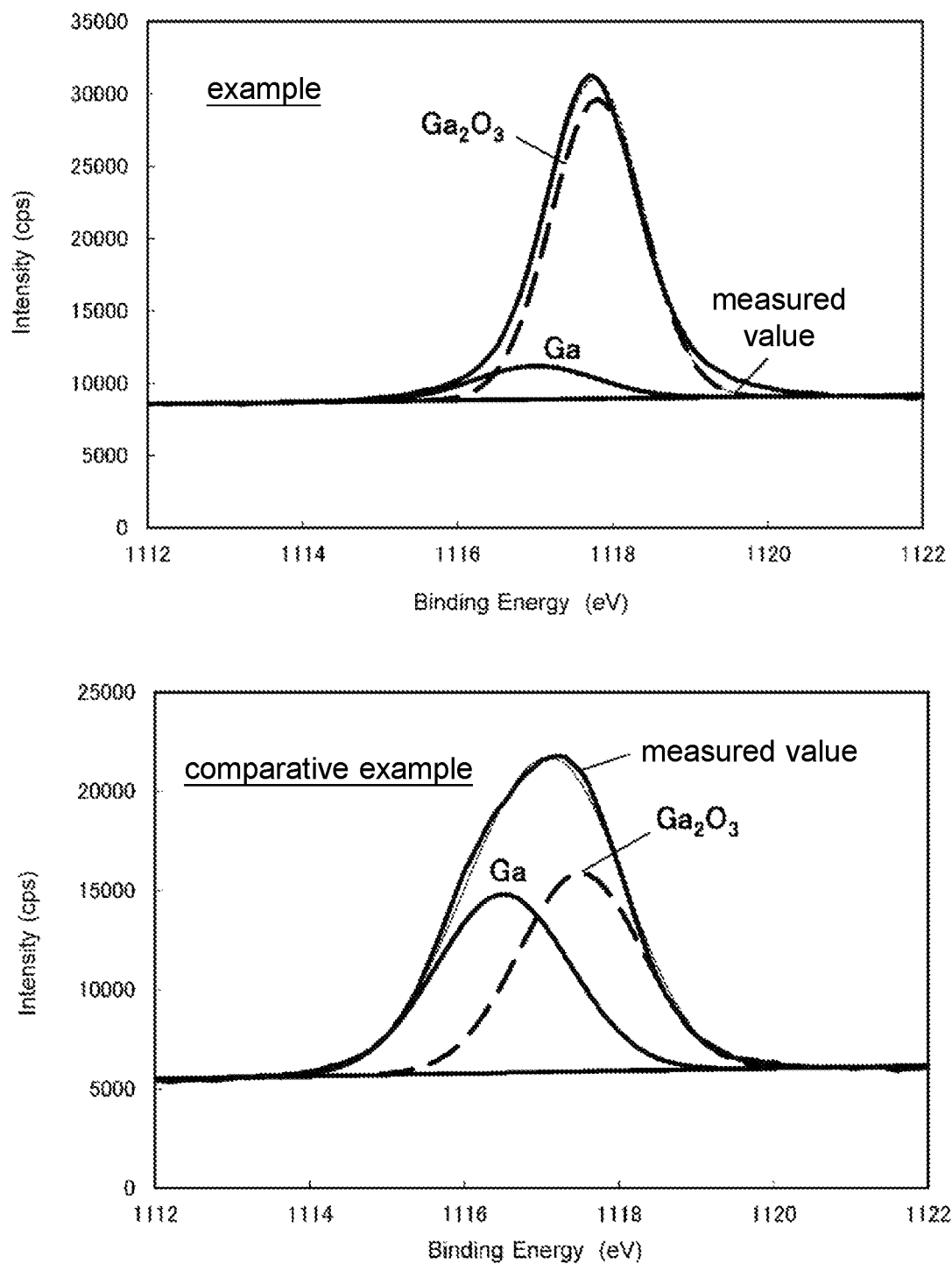
FIG. 6 is a graph showing XPS spectra of Ga2p3/2 in an IGZO film according to the present invention and an IGZO film according to a conventional example.

FIG. 6 shows XPS spectra of $Ga2p_{3/2}$ obtained by the XPS analyzer. In addition, FIG. 7 shows a ratio of each component obtained by performing peak separation on XPS spectrum of $Ga2p_{3/2}$, XPS spectrum of $In3d_{5/2}$, and XPS spectrum of $Zn2p_{3/2}$.

Figure 7:
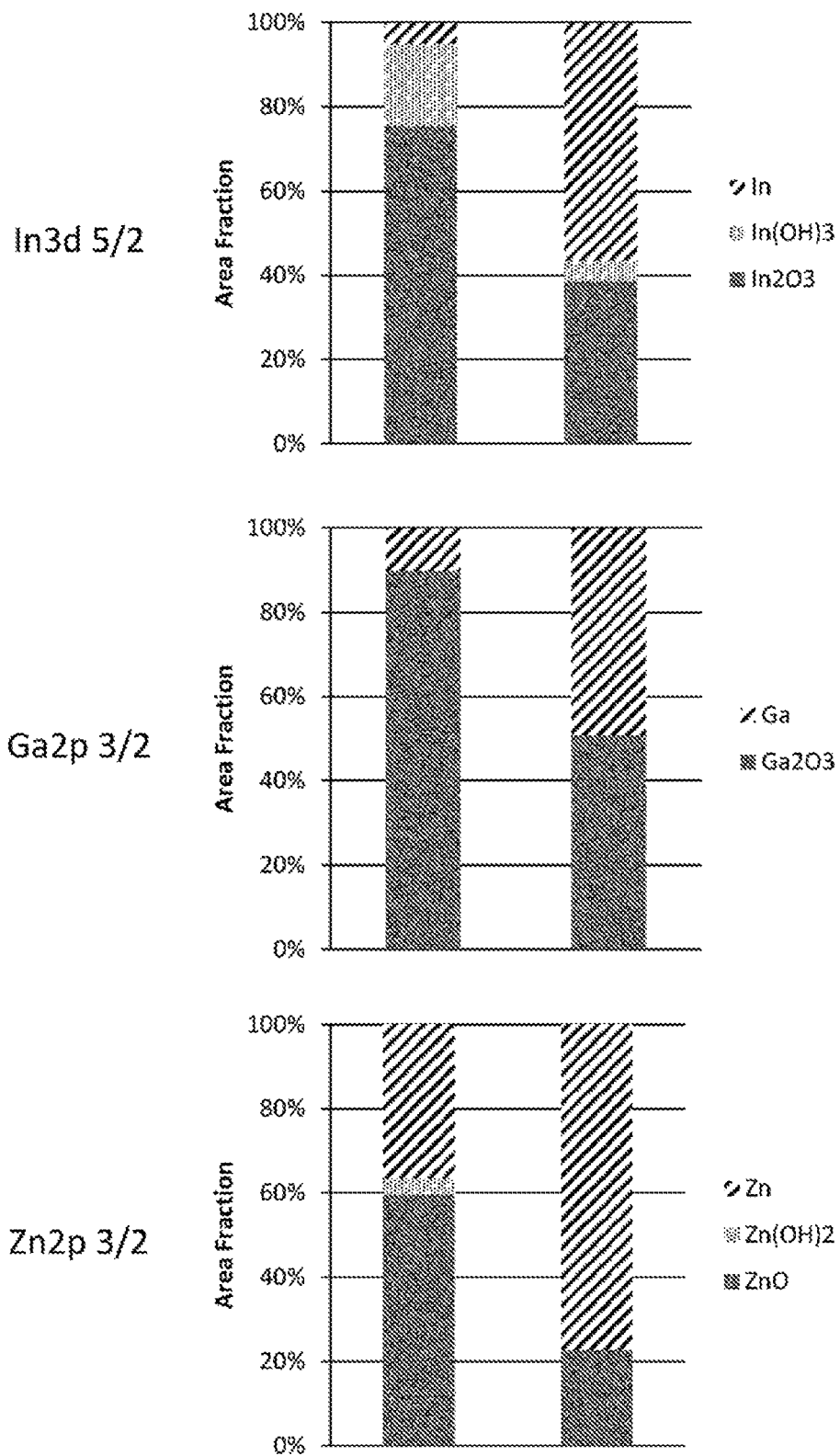
FIG. 7 is a graph showing percentages of components in the IGZO film according to the present invention and the IGZO film according to the conventional example.

As seen from FIGS. 6 and 7, by using the sputtering apparatus of the embodiment, it is possible to form a film in which 60% or more of metallic element is coupled to oxygen, without adding a reactive gas (oxygen gas).

<Effects of Embodiment>

According to the sputtering apparatus 100 of the embodiment configured as described above, since the capacitor 53 is connected electrically in series to the mutually adjacent metal pipes 51 via the insulating pipe 52, to be simply put, synthetic reactance of the antenna 5 is obtained by subtracting capacitive reactance from inductive reactance, and the impedance of the antenna 5 can be reduced. As a result, even in a case of the elongated antenna 5, an increase in the impedance of the antenna can be inhibited, it is easy for the high-frequency current to flow to the antenna 5, and the plasma P can be generated efficiently. Consequently, the density of the plasma P can be increased, and a film forming speed can be increased.

In particular, according to the embodiment, since the space between the first electrode 53A and the second electrode 53B is filled with the cooling liquid CL and is used as the dielectric substance, it is possible to eliminate a gap between the electrodes 53A and 53B and the dielectric substance which configure the capacitor 53. As a result, the uniformity of the plasma P is improved, and the uniformity of film formation is improved. In addition, by using the cooling liquid CL as the dielectric substance, there is no need to prepare the dielectric substance of a liquid different from the cooling liquid CL, and the first electrode 53A and the second electrode 53B can be cooled. The cooling liquid CL is adjusted by the temperature adjusting mechanism to the constant temperature, and the cooling liquid CL is used as the dielectric substance, and thereby it is possible to inhibit a change in relative dielectric constant caused by a change in temperature so as to inhibit a change in capacitance value. Consequently, it is also possible to improve the uniformity of the plasma P. Further, when water is used as the cooling liquid CL, the relative dielectric constant of water is about 80 (20° C.) and is higher than that of a dielectric sheet made of resin, and thus it is possible to configure the capacitor 53 that resists a high voltage.

Moreover, according to the embodiment, since the setting of the high-frequency voltage supplied to the antenna 5 and the bias voltage to the target T can be performed independently, it is possible to set the bias voltage to a low voltage independently from generation of the plasma P to the extent that ions in the plasma P are attracted to the target T such that the sputtering is performed. As a result, since it is possible to perform the sputtering on the target T with a low voltage, it is possible to reduce a change between a material composition of the target T and a composition of the film formed on the substrate W. In addition, since the plasma P for sputtering is generated using the antenna 5, it is possible to more uniformly consume the target T and to improve use efficiency of the target T, compared to the case of the magnetron sputtering apparatus. Furthermore, the embodiment employs a configuration in which a direct current magnetic field is not formed in the vicinity of the front surface of the target, and the embodiment is easily applied to a magnetic material.

Besides, arc discharge that may occur in the gap between the electrodes 53A and 53B and the dielectric substance can be eliminated, and the capacitor 53 can be prevented from being damaged due to the arc discharge. In addition, it is possible to set the capacitance value with high precision based on a distance between the first electrode 53A and the second electrode 53B, a facing surface area, and the relative dielectric constant of the cooling liquid CL, without consideration of the gap. Further, a structure for pressing the electrodes 53A and 53B and the dielectric substance to fill the gap is not required, and it is possible to prevent complexity of a structure around the antenna caused by the pressing structure and prevent deterioration of the uniformity of the plasma P due to the complexity.

Other Modification Embodiments

Moreover, the present invention is not limited to the above-described embodiment.

For example, in the embodiment, the antenna has a straight line shape; however, the antenna may have a curved or bent shape. In this case, the metal pipe may have a curved or bent shape, and the insulating pipe may have a curved or bent shape.

The extension portions of the electrode of the embodiment have a cylindrical shape; however, the extension portion may have a rectangular cylinder shape other than the cylindrical shape or may have a flat plate shape or a curved or bent plate shape.

Figure 8:
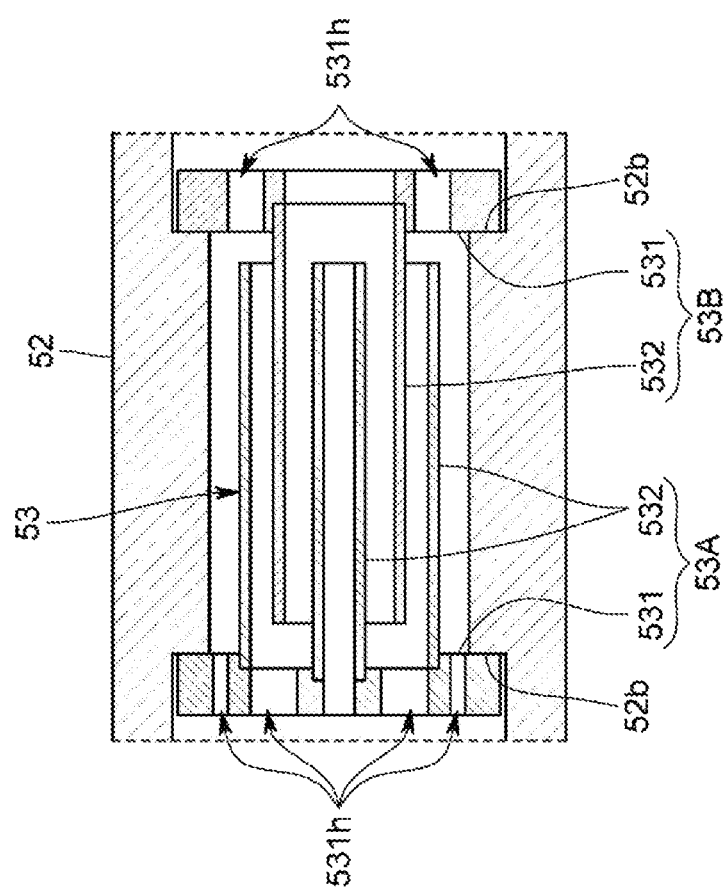
FIG. 8 is a partially enlarged sectional view showing a capacitor portion in an antenna of a modification embodiment.

In the embodiment, the capacitor 53 has a two-cylinder structure consisting of two extension portions having the cylindrical shape; however, as illustrated in FIG. 8, three cylindrical extension portions 532 or more may be coaxially disposed. In this case, the extension portion 532 of the first electrode 53A and the extension portion 532 of the second electrode 53B are configured to be alternately disposed. In FIG. 8, of the three extension portions 532, the two extension portions at the inner side and the outer side are the extension portions 532 of the first electrode 53A, and the one extension portion at the center is the extension portion 532 of the second electrode 53B. According to this configuration, it is possible to increase the facing surface area without increasing a dimension of the capacitor 53 in the axial direction.

Figure 9:
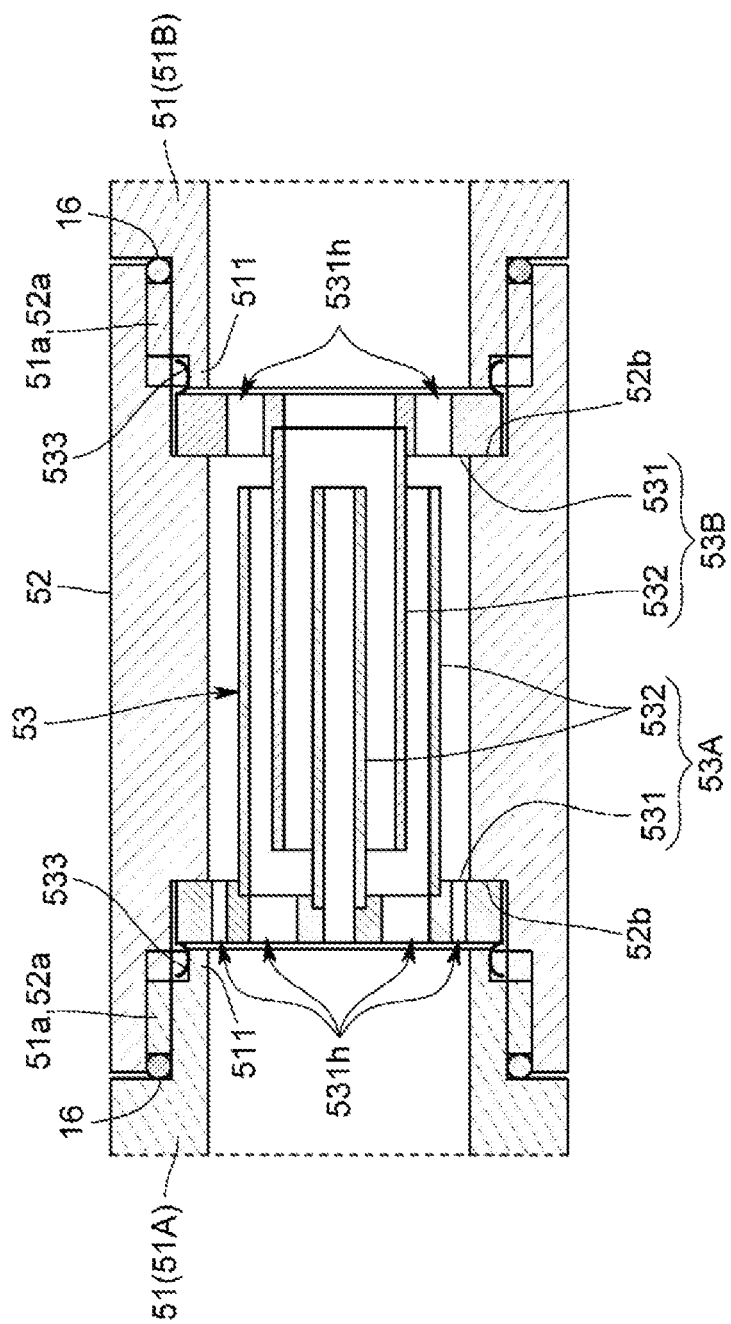
FIG. 9 is a partially enlarged sectional view showing a capacitor portion in an antenna of another modification embodiment.

Further, regarding the contact between the electrodes 53A and 53B and the metal pipes 51, in addition to the contact between the end surfaces thereof, contact terminals 533 may be arranged on the electrodes 53A and 53B such that the contact terminals 533 come into contact with the respective metal pipes 51, as illustrated in FIG. 9. In the configuration in FIG. 9, the contact terminals 533 are arranged to project outward from the flange portions 531 of the electrodes 53A and 53B in the axial direction, and the contact terminals 533 come into press contact with outer circumferential surfaces of the contact portions 511 of the metal pipes 51. In this configuration, relative positions of the electrodes 53A and 53B are defined by surfaces of the recessed portion 52b of the insulating pipe 52 directed outward in the axial direction.

Further, a part of the metal element 51 at one side of the insulating element 52 may be used as the first electrode 53A. In this case, it is considered that the second electrode 53B connected electrically to the metal element 51 at the other side of the insulating element 52 is configured to be extended into the metal element 51 at the one side of the insulating element 52 through the inside of the insulating element 52.

Furthermore, the conductor element and the insulating element have a tubular shape with one inner flow channel; however, the conductor element and the insulating element may have two inner flow channels or more or have a diverging inner flow channel.

The embodiment described above employs the configuration in which the plurality of target-holding parts are arranged; however, a configuration in which one target holding part is arranged may also be employed. In this case, it is also desirable to employ a configuration in which a plurality of antennas is arranged; however, a configuration in which one antenna is arranged may also be employed.

However, as illustrated in FIG. 10(a), when the plurality of targets T arranged along the front surface of the substrate W is disposed substantially at the same height from the front surface of the substrate W, the film-thickness distribution of the film formed on the front surface of the substrate W (film-thickness distribution obtained by overlapping film thicknesses due to the targets T) is thin at respective outer sides of the targets T in the arrangement direction as shown in FIG. 10(b).

Hence, in order to inhibit the variations in film thickness along the arrangement direction of the targets T, it is necessary to locate the thin portions of the target T at both sides in the arrangement direction at the outer side from the substrate W. For this purpose, for example, sub-targets T (the two targets T at the outer sides in FIG. 10(a)) for compensating the film thicknesses at both sides in the arrangement direction are arranged at the respective outer sides in the arrangement direction of the targets T (the three targets T at the inner side in FIG. 10(a)) which are mainly used in forming the film on the substrate W, and a problem arises in that the necessary number of targets T increases.

Therefore, in order to inhibit variations in film thickness along the arrangement direction without an unnecessary increase of the targets T, preferably, the plurality of elongated targets T is arranged along the front surface of the substrate W to be substantially parallel to each other, as illustrated in FIG. 11(a), and of the targets T, the targets T respectively positioned at the outer sides in the arrangement direction are closer to the front surface of the substrate W than the target T positioned at the inner side in the arrangement direction.

Here, three targets T are disposed at equal intervals when viewed from above, and the two targets T at the outer sides are disposed at a lower height position from the front surface of the substrate W than the target T positioned in the middle.

In this configuration, it is possible to inhibit the vibrations in film thickness in the arrangement direction without arranging, at both sides of the three targets T, the targets for compensating the film thicknesses at both sides in the arrangement direction, as illustrated in FIG. 11(b).

In addition, as another embodiment for inhibiting variations in film thickness along the arrangement direction of the targets T and reducing the number of targets, preferably, the plurality of elongated targets T is arranged along the front surface of the substrate W to be substantially parallel to each other, as illustrated in FIG. 12(a), and of the targets T, an applied voltage applied to the targets T respectively positioned at the outer sides in the arrangement direction is higher than an applied voltage applied to the target T positioned at the inner side in the arrangement direction.

Specifically, an outer-target bias power supply 11a that applies voltages to the targets T respectively positioned at the outer sides in the arrangement direction and an inner-target bias power supply 11b that applies a voltage to the target T positioned at the inner side in the arrangement direction are separately arranged from each other, and the respective target biasing-power supply 11a and 11b are independently controlled. Here, three targets T are disposed at equal intervals when viewed from above, and the applied voltages to the two targets T at the outer sides are higher than the applied voltage to the target T positioned in the middle. Moreover, height positions from the front surface of the substrate W to the targets T are aligned.

In this configuration, without arranging, at both sides of the three targets T, the targets for compensating the film thicknesses at both sides in the arrangement direction, it is possible to inhibit the vibrations in film thickness in the arrangement direction of the targets T, as illustrated in FIG. 12(b).

In order to inhibit the variations in film thickness along the arrangement direction of the targets T, the configuration in FIG. 11(a) and the configuration in FIG. 12(a) may be combined to each other, in addition to the configurations described above. In other words, while the targets T at the outer sides in the arrangement direction are disposed closer to the front surface of the substrate W than the target T at the inner side in the arrangement direction, the applied voltage to the targets T at the outer sides in the arrangement direction may be higher than the applied voltage to the target T at the inner side in the arrangement direction.

In addition, a case of arranging three targets is described in FIGS. 11(a) and 12(a); however, more targets may be arranged.

For example, when five targets are arranged, height positions of three targets T at the inner side in the arrangement direction may be aligned and the two targets T at the outer sides in the arrangement direction may have low height positions. In addition, the one target T at the center in the arrangement direction, the two targets at the outer sides, and the two targets at the further outer sides may have height positions gradually lowered by this order. In other words, the height positions from the target T at the center in the arrangement direction toward the targets T at the outer sides in the arrangement direction may become lowered step by step.

In addition, as illustrated in FIG. 10(c), similar to the variations in film thickness along the arrangement direction of the targets T described above, the film thicknesses at both sides in the longitudinal direction of the targets T also become gradually thinner.

Therefore, in order to inhibit the film thickness from becoming thinner at both sides in the longitudinal direction of the targets T, preferably, a plurality of elongated first targets T1 is arranged along the front surface of the substrate W to be substantially parallel to each other, as illustrated in FIG. 13(a), and a pair of second targets T2 is respectively arranged at both sides in the longitudinal direction of the first targets T1 and is disposed to be extended in the arrangement direction of the first targets T1.

Here, three first targets T1 are disposed at equal intervals when viewed from above, and the first targets T1 at the outer sides in the arrangement direction are disposed at a lower height position from the front surface of the substrate W than the first target T1 positioned at the inner side in the arrangement direction, similarly to FIG. 11(a). In addition, the pair of second targets T2 are aligned at the height positions of the first targets T1 at the outer sides in the arrangement direction. In addition, here, the first targets T1 and the second targets T2 are connected to the common target bias power supply 11.

In this configuration, since the second targets T2 are arranged at both sides in the longitudinal direction of the first targets T1, it is possible to increase film thicknesses at both sides in the longitudinal direction of the first targets T1 by performing sputtering on the second targets T2, as illustrated in FIG. 13(c).

In addition, since the first targets T1 at the outer sides in the arrangement direction are disposed at the lower height positions from the front surface of the substrate W than the first target T1 at the inner side in the arrangement direction, it is possible to inhibit variations in film-thickness distribution along the arrangement direction of the first targets T1, as illustrated in FIG. 13(b).

As a result, it is possible to inhibit, in both the arrangement direction and the longitudinal direction of the first targets T1, the variations in film-thickness distribution of a film formed on the substrate W.

Moreover, in order to inhibit the variations in film-thickness distribution along the arrangement direction, the configuration shown in FIG. 12(a) may be employed. That is, the first targets T1 at the outer sides in the arrangement direction and the pair of second targets T2 may be connected to a common first target bias power supply, and the first target T1 at the inner side in the arrangement direction may be connected to a second target bias power supply separate from the first target bias power supply such that the applied voltage to the first targets T1 at the outer sides in the arrangement direction and the pair of second targets T2 may be higher than the applied voltage to the first target T1 at the inner side in the arrangement direction.

In addition, the present invention is not limited to the above-described embodiments, and it is needless to say that various modifications can be made in a range not departing from the gist of the invention.

INDUSTRIAL APPLICABILITY

According to the present invention, plasma for sputtering can be efficiently generated using an antenna, and plasma uniformity can be improved so as to improve uniformity of film formation.

What is claimed is:

1. A sputtering apparatus that performs sputtering on a target with plasma to form a film on a substrate, the sputtering apparatus comprising:
    a vacuum container, which is evacuated and into which a gas is introduced;

a substrate-holding part for holding the substrate inside the vacuum container;

a target-holding part for holding the target so as to face the substrate inside the vacuum container; and a plurality of antennas which generates the plasma and has a flow channel in which a cooling liquid flows, wherein the antenna includes at least two tubular conductor elements, a tubular insulating element that is arranged between mutually adjacent conductor elements and insulates the conductor elements, and a capacitive element that is arranged in the flow channel and is connected electrically in series to the mutually adjacent conductor elements, and wherein the capacitive element includes a first electrode which is connected electrically to one of the mutually adjacent conductor elements, a second electrode which is connected electrically to the other of the mutually adjacent conductor elements and is disposed facing the first electrode, and a dielectric substance that fills a space between the first electrode and the second electrode, and the dielectric substance is the cooling liquid.

2. The sputtering apparatus according to claim 1, wherein the target is an oxide semiconductor material.

3. The sputtering apparatus according to claim 1, comprising:

a sputtering gas supply mechanism ha supplies a sputtering gas to the vacuum container, wherein the sputtering gas supply mechanism supplies only an argon gas to the vacuum container.

4. The sputtering apparatus according to claim 1, wherein each of the first and second electrodes has a flange portion which comes into electrical contact with an end portion of the conductor elements at a side of the insulating element and an extension portion extended from the flange portion toward the side of the insulating element.

5. The sputtering apparatus according to claim 4, wherein the extension portions of the first and second electrodes have a tubular shape and are disposed coaxially with each other.

6. The sputtering apparatus according to claim 1, wherein the target-holding part holds a plurality of elongated targets along a front surface of the substrate in a state that the plurality of targets are substantially parallel to each other, and of the plurality of targets, the plurality of targets respectively positioned at outer sides in an arrangement direction are closer to the front surface of the substrate than the target positioned at an inner side in the arrangement direction.

7. The sputtering apparatus according to claim 1, wherein the target-holding part holds a plurality of elongated targets along a front surface of the substrate in a state that the plurality of targets are substantially parallel to each other, and of the plurality of targets, an applied voltage applied to the plurality of targets respectively positioned at outer sides in an arrangement direction is higher than an applied voltage applied to the plurality of targets positioned at an inner side in the arrangement direction.

8. The sputtering apparatus according to claim 1, wherein the target-holding part holds a plurality of elongated targets along a front surface of the substrate such that longitudinal directions of the plurality of targets are substantially parallel to each other and holds a pair of second targets arranged at both sides of the plurality of targets in the longitudinal direction and extended along an arrangement direction of the plurality of targets.

* * * * *